United States Patent [19]

Krishna et al.

[11] 3,777,227

[45] Dec. 4, 1973

[54] DOUBLE DIFFUSED HIGH VOLTAGE, HIGH CURRENT NPN TRANSISTOR

[75] Inventors: Surinder Krishna, Greensburg; John R. Davis, Jr., Export, both of Pa.

[73] Assignee: Westinghouse Electric Corporation, Pittsburgh, Pa.

[22] Filed: Aug. 21, 1972

[21] Appl. No.: 282,624

[52] U.S. Cl. 317/235 R, 317/235 AJ, 317/235 AM, 317/235 AN, 317/235 AQ

[51] Int. Cl. .......... H01l 5/00

[58] Field of Search .......... 317/235

[56] References Cited

UNITED STATES PATENTS

| | | | |
|---|---|---|---|
| 3,186,879 | 6/1965 | Schnable | 148/1.5 |
| 3,697,827 | 10/1972 | Simon | 317/235 |
| 3,615,932 | 10/1971 | Makimoto et al. | 148/175 |
| 3,322,581 | 5/1967 | Hendrickson et al. | 148/175 |
| 3,088,888 | 5/1963 | Leff | 204/143 |
| 2,829,999 | 4/1958 | Gudmundsen | 148/33 |
| 3,487,276 | 12/1969 | Wolley | 317/235 |

*Primary Examiner*—John W. Huckert
*Assistant Examiner*—E. Wojciechowicz
*Attorney*—F. Shapoe et al.

[57] ABSTRACT

An NPN transistor with high voltage and high current capacities is provided in a semiconductor body having a thin internal portion and a thick integral peripheral portion. The thin portion has a substantially uniform width of greater than about 28 microns and oppositely facing surface areas each of greater than about 0.10 $cm^2$. The thick peripheral portion has a width greater than about 150 microns and annular dimension i.e. radial width greater than 10 microns. The base region has two contiguous impurity portions. A first impurity portion adjoins a major, preferably planar surface of the semiconductor body at the peripheral portion and has an impurity concentration of boron of at least $1 \times 10^{19}$ atoms per cubic centimeter at the surface and a steep impurity concentration gradient to provide good ohmic and thermal properties. A second contiguous impurity portion is in internal portions of the body between emitter and collector regions and has a lower impurity concentration of gallium and/or aluminum and shallower impurity concentration gradient than the first impurity portion. Preferably, first and second impurity portions of the base region are formed by the simultaneous diffusion of boron and gallium and/or aluminum.

4 Claims, 9 Drawing Figures

DOUBLE DIFFUSED HIGH VOLTAGE, HIGH CURRENT NPN TRANSISTOR

FIELD OF THE INVENTION

The present invention relates to semiconductor devices and particularly transistors. It is useful in providing a transistor with high voltage capacity, e.g. 2000 volts, as well as high current capacity, e.g. 100 amperes.

BACKGROUND OF THE INVENTION

Junction transistors are well known in the art. They are formed in single crystal semiconductor bodies or wafers having two opposed major surfaces. They have emitter and collector regions of one semiconductive type of impurity adjoining the major surfaces and a base region of the opposite semiconductive type of impurity in the interior of the body between the emitter and collector regions. Two PN junctions are thus present, one at the transition between the emitter and base regions and the other at the transition between the base and collector regions.

Efforts in the past have been directed primarily to optimizing the transistor structure to produce economical transistors having high voltage, high speed and high current operating characteristics. Solutions to a number of the difficulties have been presented in the copending applications Ser. No. 257,088, filed May 26, 1972, Ser. No. 249,981, filed May 3, 1972, Ser. No. 218,300, filed Jan. 17, 1972 and Ser. No. 259,404, filed June 5, 1972. But a problem still remains of making transistors with both high voltage and high current capacities and in particular NPN transistors with such capacities that are complimentary to PNP transistors, i.e. have the same operating characteristics.

In order to increase the current capacity of a high voltage transistor, it has been known to increase the impurity concentration in the base region adjacent the ohmic contact at the surface of the semiconductor body. In this way the voltage drop between the emitter and base regions with the collector region open (i.e. VEBO) is decreased and the injection efficiency and current gain correspondingly increased. However, an added diffusion step with attendant increases in expense and decreases in quality control has heretofore been required. Moreover, difficulty was encountered in making complimentary pairs of NPN and PNP transistors because of the differing diffusion rates of N and P type impurities.

The present invention overcomes these difficulties and provides an inexpensive NPN transistor with both high voltage and high current capacities, and with complimentary performance characteristics to available PNP transistors.

SUMMARY OF THE INVENTION

An NPN transistor with high voltage and high current capacities is provided in a semiconductor body of greater than 150 microns in thickness having opposed major surfaces. The body has a thin internal portion with a substantially uniform width of greater than about 28 microns and preferably greater than 94 microns and oppositely facing surface areas each of greater than about 0.10 $cm^2$. The body also has an integral thick peripheral portion with a width corresponding to the thickness of the body and an annular dimension i.e. radial width greater than 10 microns. An abrupt transition is hence made between the thin internal portion and the thick peripheral portion.

The base region of P type impurity has two contiguous impurity regions. A first impurity portion adjoins a major, preferably planar surface of the semiconductor body at the peripheral portion and has an impurity concentration of boron of at least $1 \times 10^{19}$ atoms per cubic centimeter at the surface and a steep impurity concentration gradient to provide good ohmic and thermal properties. A second contiguous impurity portion is in internal portions of the body between emitter and collector regions and has a lower impurity concentration of gallium and/or aluminum and shallower impurity concentration gradient than the first impurity portion. Preferably the first and second impurity portions of the base region are formed by the simultaneous diffusion of boron and gallium and/or aluminum into a major surface of the semiconductor body.

By way of explanation, it should be noted that the impurity concentration gradient is the change in impurity concentration with a change in distance from a reference point such as a surface or junction of the transistor. A steep gradient is one which has relatively large and abrupt changes in impurity concentrations with changes in distance. A shallow gradient is one which has relatively small and gradual changes in impurity concentrations with changes in distance.

Other details, objects and advantages of the invention will become apparent as the following description of a present preferred embodiment and a present preferred method of practicing the same proceeds.

BRIEF DESCRIPTION OF THE DRAWINGS

In the accompanying drawings, the present preferred embodiments of the invention and the present preferred methods of practicing the invention are illustrated in which:

FIG. 8 is a cross-sectional view through the center of a finished NPN transistor.

DESCRIPTION OF THE PREFERRED EMBODIMENTS

Figure 1:
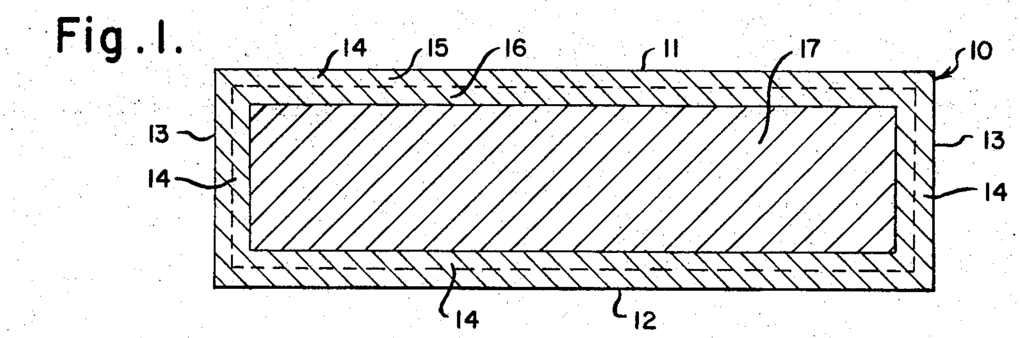
FIGS. 1–8 are cross-sectional views in elevation through the center of an NPN transistor at various stages of manufacture.

Referring to FIG. 1, a circular silicon semiconductor wafer or body 10 of a thickness of greater than 150 microns, such as 250 microns, has a given level of N-type impurity therethrough corresponding to a resistivity of greater than 30 ohm-cms and preferably greater than 80 ohm-cms. Preferably the body has a resistivity therethrough of at least 120 to 130 ohm-cms corresponding to a low impurity concentration of about $6 \times 10^{13}$ atoms per cubic centimeter or less.

Body 10 is disposed in a diffusion furnace. It has simultaneously diffused into opposed major surfaces 11 and 12 and curvilinear side surfaces 13 boron and gallium and/or aluminum to form P impurity region 14 adjoining said surfaces preferably to a depth of from 20 to 75 microns and most desirably about 30 microns. The diffusion is preferably performed in an inert atmosphere, e.g. argon, in a closed or open quartz tube, e.g. at about 1235°C. for about 30 minutes. If a closed tube is used, solid diffusion sources are necessarily used; if an open tube is used, gas diffusion sources are preferably used where possible. For further description of the simultaneous diffusion of boron and gallium, see application Ser. No. 218,097, filed Jan. 17, 1972, and assigned to the same assignee as the present invention.

P impurity region 14 divides itself by virtue of the diverse diffusion rates of boron and gallium and/or aluminum into first and second impurity portions 15 and 16. First impurity portion 15 adjoins surfaces 11, 12 and 13, has a high impurity concentration, such as greater than $1 \times 10^{19}$ atoms per cubic centimeter at the surfaces, and has a steep impurity concentration gradient, such as from about $2.5 \times 10^{21}$ atoms/$cm^4$ (a 40 micron depth diffusion of $1 \times 10^{19}$ atoms/$cm^3$ surface concentration) to $1.0 \times 10^{24}$ atoms/$cm^4$ (a 10 micron depth diffusion of $1 \times 10^{21}$ atoms/$cm^3$ surface concentration). Second impurity portion 16 is contiguous with the first impurity portion 15 and extends into the interior of body 10. Second impurity portion 16 has a lower impurity concentration than the first impurity portion 15, e.g. ranging from about $1 \times 10^{14}$ to $1 \times 10^{17}$ atoms/$cm^3$, and has a shallower impurity concentration gradient than the first impurity portion 15, e.g. ranging from about $1.3 \times 10^{20}$ atoms/$cm^4$ (a 75 micron depth diffusion of $1 \times 10^{18}$ atoms/$cm^3$ surface concentration) to about $5 \times 10^{21}$ atoms/$cm^4$ (a 20 micron depth diffusion of $1 \times 10^{18}$ atoms/$cm^3$ surface concentration).

Relative widths of first and second impurity regions 15 and 16 can be controlled to provide the desired electrical characteristics of the transistor. The ratio of the width of the first impurity region 15 to the width of the second impurity region 16 is controlled by varying the ratio of the concentration of boron to the concentration of gallium and/or aluminum. If a closed tube is used, the ratio is governed by saturation conditions in the tube; and the saturation conditions are a function of the temperature and pressure in the tube. With standard pressure, the temperature can range from the minimum temperature to vaporize the particular diffusion sources (e.g. about 1100°C.) to the temperature at which the semiconductor body 10 becomes plastic (e.g. about 1325°C.). For optimum electrical characteristics, maximum impurity concentrations are provided at the surfaces. It is therefore preferred that closed tube diffusion be performed as near 1235°C. as practicable. Most desirably, however, the open tube technique is used because it provides greater flexibility in controlling the ratio of boron to gallium and/or aluminum. With the open tube, the ratio is not limited to the saturation conditions which can be obtained, but can be varied to provide the desired electrical characteristics in the transistor.

The result of forming P impurity region 14 in body 10 by diffusion is the formation of N- impurity region 17 extending throughout the remainder of the interior of body 10. A PN junction is formed at the transition from P impurity region 14 to N- impurity region 17.

Figure 2:
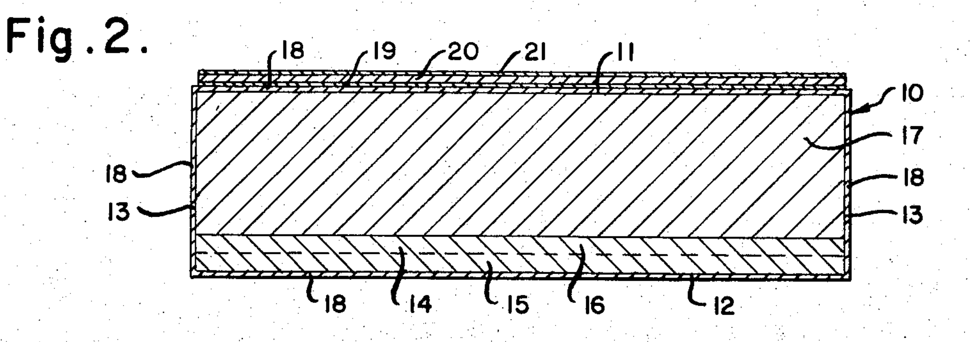

Referring to FIG. 2, P impurity region 14 is removed from adjacent surfaces 11 and 13 preferably by standard lap etching techniques. P impurity region 14 is thus maintained only adjacent major surface 12. Oxide coating 18 is thereafter formed over surfaces 11, 12 and 13 to mask the surfaces for diffusion. The oxide coating is preferably formed by heating the body 10 in an oxygen rich atmosphere such as steam or oxygen for a short period of time, e.g. 30 to 60 minutes.

Still referring to FIG. 2, bonding layer 19 of a metal having strong bonding properties to silicon oxide and to metals is formed over oxide coating 18 at major surface 11. Suitable metals for this purpose are titanium, chromium, aluminum, zirconium, molybdenum, vanadium, columbium, tantalum and tungsten. Preferably bonding layer 19 is formed by depositing the metal by evaporation by procedures well known in the art to a thickness typically of about 500 Angstroms.

Vapor deposited metal layer 20 is subsequently formed over bonding layer 19 to form an adherent metal layer over oxide coating 18 at major surface 11. Preferably the metal selected should be resistant to various etchants that will etch oxide coating 18 and body 10, as well as be readily electroplatable. Suitable metals for the vapor deposited layer are the Group IB, VIA and VIII metals, and particularly gold, platinum, nickel, palladium and tungsten. Preferably, layer 20 is formed by depositing the metal by evaporation by procedures well known in the art to a thickness typically of about 2000 Angstroms.

Thereafter a photomask layer 21 of a type well known in the art is placed over the metal layer 20.

Figure 3:
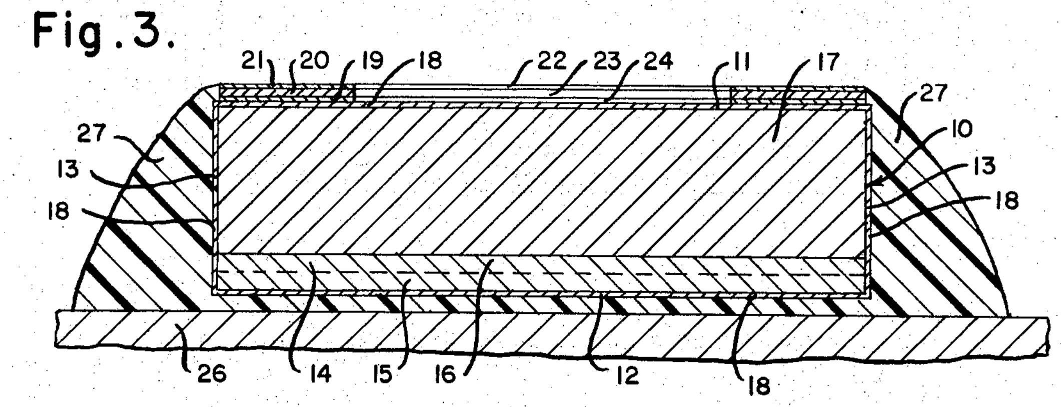

Referring to FIG. 3, coincident windows 22, 23 and 24 are provided in layers 21, 20 and 19, respectively, to expose selected internal areas of oxide coating 18 at surface 11. Window 22 is formed in photomask layer 21 by methods well known in the art, e.g. masking the selected internal portions; exposing the remaining peripheral portions to light to make those portions water-insoluble; and washing away the unmasked water-soluble portions to leave window 22 in selected internal portions of photomask layer 21.

Window 23 is then formed by etching through vapor deposited metal layer 20 with a suitable etchant to which photomask layer 21 and bonding layer 19 are resistant. Such etchants vary with the specific metal selected to form layer 20 and are well known to those skilled in the art. For example, a widely used recipe to etch gold is an aqueous solution having 3 parts hydrochloric acid, 1 part nitric acid and 4 parts water.

Thereafter, window 24 is formed in bonding layer 19 by etching through layer 19 with a suitable etchant without attacking the oxide coating 18, the body 10 and other layers. Such etchants also vary with the metal selected to form layer 19, and are widely known and used in the art. For example, a recipe used to etch titanium is a buffered aqueous solution having 1 part ammonium fluoride, 2 parts hydrochloric acid and 5 parts water.

Figure 4:
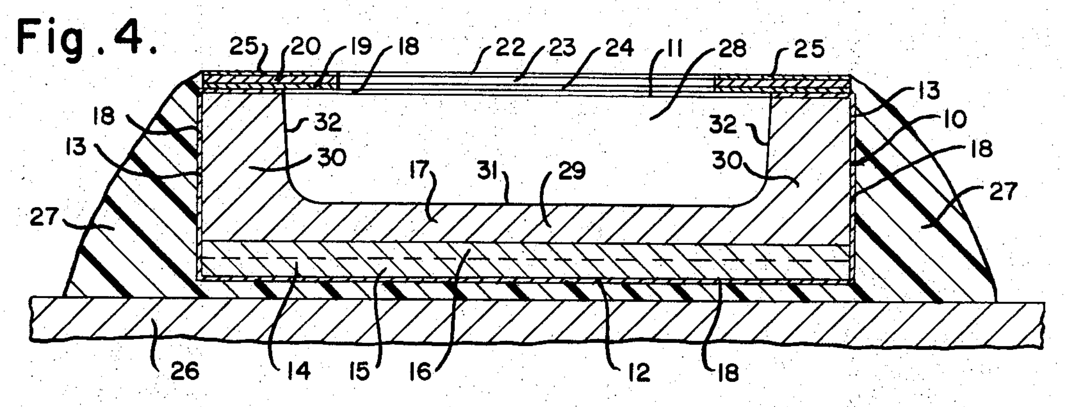

Referring to FIG. 4, photomask layer 21 is removed and etchant resistant metal layer 25 is electroplated over the remainder of layer 20 by standard electroplating methods typically to a thickness from 500 to 10,000 Angstroms and possibly on the order of 2 mils. Etchant resistant layer 25 may be formed by the same metal used to form layer 20. The elecroplating closes pin holes developed in the layer 20 and forms a continuous etchant resistant coating for the subsequent deep etching step.

Thereafter, the remaining portions of oxide coating 18 at surfaces 12 and 13 are masked. A low solid wax such as Apiezon™, paraffin or a dental wax is spread over substrate 26 (e.g. one-eighth to one-fourth inch in thickness) of polytetrafluoroethylene, stainless steel coated with gold or glass. The prepared semiconductor body 10 is then embedded in the wax, and the wax solidified to form protective coating 27 over oxide coating 18 at surfaces 12 and 13.

Still referring to FIG. 4, well 28 is etched in semiconductor body 10 to provide body 10 with thin internal portion 29 and a thick peripheral portion 30. Body 10 is immersed in an etchant suitable for etching body 10 and oxide coating 18, and resistant to layer 25 and protective coating 27. The body is continuously agitated in the etchant under carefully adjusted conditions to provide well 28 with a substantially flat foundation surface 31 that is substantially parallel to major surface 12. The composition of the etchant will vary with the composition of body 10 and etchant resistant layer 25. A suitable etchant for etching silicon semiconductor bodies coated with gold is an acid solution having 3 parts hydrofluoric acid, 5 parts acetic acid and 15 parts nitric acid. Adjustments and conditions for obtaining flat foundation surface 31 are known in the art, e.g. turning the container and solution in which body 10 is immersed on an obliquely positioned turntable at a few revolutions per minute.

By precisely controlling the etching conditions (i.e. the concentration of the etchant, length of etching and agitation rate) the dimensions of well 28 and in turn internal portion 29 can be precisely controlled. Internal portion 29 has a substantially uniform width of greater than about 28 microns for 400 volts capacity and preferably greater than about 94 microns for 1000 volts (e.g. 150 microns for 2000 volt capacity, and 190 microns for 3000 volt capacity), and opposed surfaces each of greater than 0.10 $cm^2$ in area. Peripheral portion 30 is the width of the starting semiconductor body 10 (e.g. 250 microns) so that there is an abrupt transition from internal portion 29 to peripheral portion 30 at the transition from foundation surface 31 to curvilinear sidewalls 32, which approach parallelity with side surfaces 13.

In this procedure, the annular dimension of the peripheral portion 30 is also precisely controlled by the size of windows 22, 23 and 24 and the etching rate. As shown, the annular dimension of the peripheral portion 30 is less than the corresponding radial dimension of internal portion 29, and preferably is as small as practicable to minimize the stored charge in the peripheral portion and in turn increase the switching speed of the transistor; see co-pending application Ser. No. 249,981, filed May 3, 1972, and assigned to the same assignee as the present invention. The annular dimension of the peripheral portion 29 must, however, be greater than about 10 microns to provide the handling requirement needed in the manufacture of the transistor.

Figure 5:
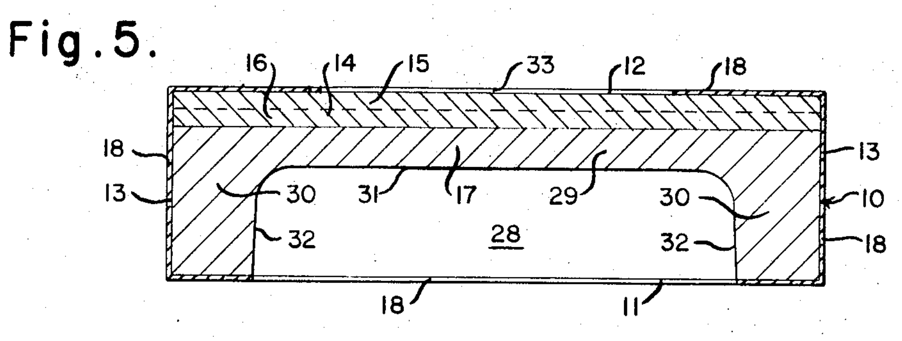
Figure 6:
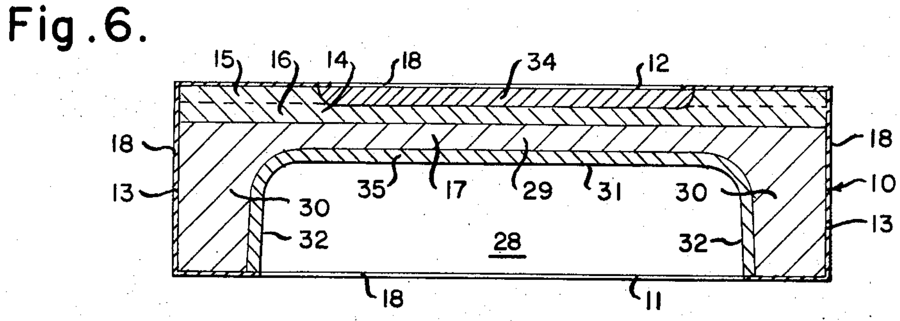
Figure 7:
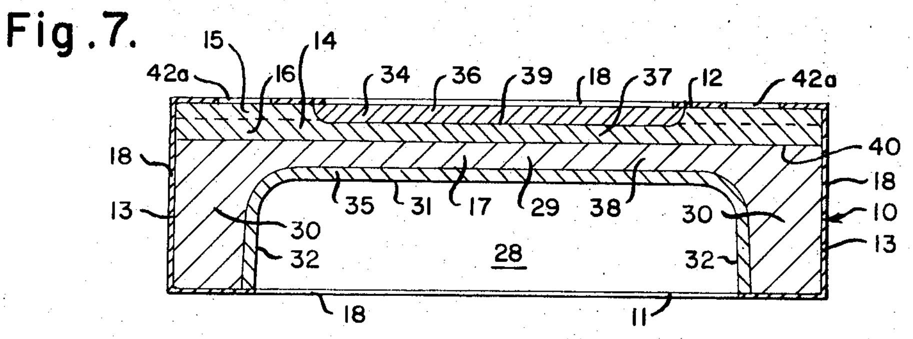

Referring to FIG. 5, metal layers 19, 20 and 25, substrate 26 and protective coating 27 are removed. Layers 19, 20 and 25 are removed by a repetition of the etching steps above described in forming windows 23 and 24. Substrate 26 and protective coating 27 are removed by liquifying the wax composition composing coating 27.

Window 33 is then formed in silicon oxide coating 18 at surface 12 by methods, i.e. masking and etching, widely known in the art to expose internal portions of major surface 12.

Figure 8:
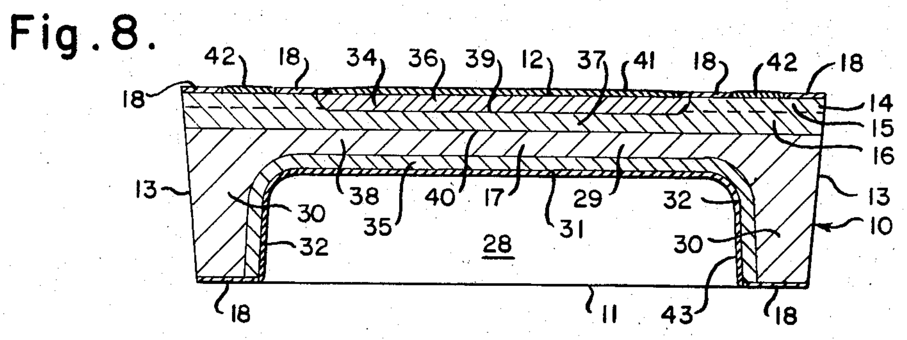

Referring to FIG. 8, N+ impurity region 34 is formed by diffusing an N type impurity (i.e. phosphorus, antimony, and/or arsenic) and preferably phosphorus into the exposed internal portions of major surface 12. The diffusion is accomplished by heating body 10 in an inert atmosphere containing an impurity producing compound, such as phosphine gas for phosphorus. The diffusion time is controlled to determine the concentration and penetration of the impurity. The diffusion is precisely controllable because the geometry of the body 10 permits the formation of a shallow (e.g. as little as 5 to 10 microns) highly concentrated (e.g. 1 × $10^{19}$ atoms/$cm^3$) emitter region. In any event, N+ impurity region 34 extends into body 10, e.g. about 20 microns, to adjoin the second impurity portion 16 of P impurity region 14 at internal portion 29 and to form a PN junction therewith.

Also second N+ impurity region 35 is formed, preferably simultaneously, with N+ impurity region 34, by diffusion of N-type impurity into the exposed foundation surface 31 and sidewalls 32 to a desired depth (e.g. 5 to 20 microns). Impurity region 35 reduces the resistivity adjoining the surfaces and provides good ohmic contact to N-impurity region 17.

An alternative procedure is to mask for diffusion with oxide coating 18 after the thin internal portion 29 is formed by deep etching. To effect this, the wafer or body 10 is cleaned with a suitable etchant and coated with an oxide by heating body 10 in an oxygen-rich atmosphere such as steam or oxygen after layers 19, 20 and 25, substrate 26 and protective coating 27 are removed from the surfaces of the body. The portions of the oxide coating at selected portions of surfaces 11 and 12 are then masked, and the exposed portions of the oxide coating etched away to expose foundation surface 31 and sidewalls 32 as well as selected internal portions of major surface 12. The above described procedure is then followed to, preferably simultaneously, diffuse N+ impurity regions 34 and 35 into the semiconductor body. This alternative, however, increases the number of production steps and the handling after internal portion 29 is formed, and in turn increases the number of rejects during production.

The NPN transistor thus formed has emitter region 36 corresponding to N+ impurity region 34, base region 37 corresponding to P impurity region 14, and collector region 38 corresponding to N− impurity region 17. Second N+ impurity region 35 is discounted in the transistor operation; it provides good ohmic contact between collector region 38 and metal contact 43. PN junction 39 is formed at the transition between emitter and base regions 36 and 37, and PN junction 40 is formed at the transition between base and collector regions 37 and 38.

The reverse breakdown voltage of N− impurity region 17 is higher than the collector reach-through voltage at internal portion 29. The width of the collector region 38 at peripheral portion 30 is at least 20 percent greater than the collector width at internal portion 39. In turn, the channeling effects at side surfaces 13 are substantially reduced and the voltage capacity of the transistor is governed by the potential across the carrier depletion region at the internal portion of body 10 at collector reach-through.

Referring to FIG. 8, metal contacts 41, 42 and 43 are affixed to semiconductor body 10 to make separate ohmic contacts with emitter region 36, base region 37 and collector region 38, respectively. Metal contact 41 is affixed to major surface 12 at internal portion 29 to contour emitter region 36, preferably as closely as possible and thereby optimize the current capacity of the transistor. Metal contact 42 is affixed in an annular shape to major surface 12 at peripheral portion 30.

And metal contact 43 is affixed to contour foundation surface 31 and sidewalls 32; it may also, if desired, extend into peripheral portion 30 at major surface 11, where N+ impurity region 35 is extended correspondingly to provide good ohmic contact. As shown, metal contacts 41, 42 and 43 are formed by providing additional windows 42A in coating 18 at surface 12, evaporating aluminum onto selective portions of the exposed surfaces through windows in the oxide coating to a thickness typically of about 70,000 to 100,000 Angstroms. Preferably, however, metal contact 43 is greater in thickness possibly to even fill-in well 28 completely to provide a heat sink for the transistor and in turn low, efficient operating temperatures in the transistor.

To complete the making of the transistor, body 10 is spin-etched by known procedures to taper side surfaces 13 to shape the electric fields found in the transistor and in turn further reduce edge leakage and localized voltage breakdown during operation. This tapering is important to reduce surface breakdown above 500 volts capacity and is essential above 2000 volts capacity. Then side surfaces 13 may in some cases, particularly at high voltage capacity, be coated with a protective coating formed by incorporating, for example 1,2-dihydroxyanthraquinone (also called "alizarin") alone or in a silicone or epoxy resin, to substantially reduce atmospheric effects on the transistor. In any event, an NPN transistor shown in FIG. 8 is thereby formed.

Figure 9:
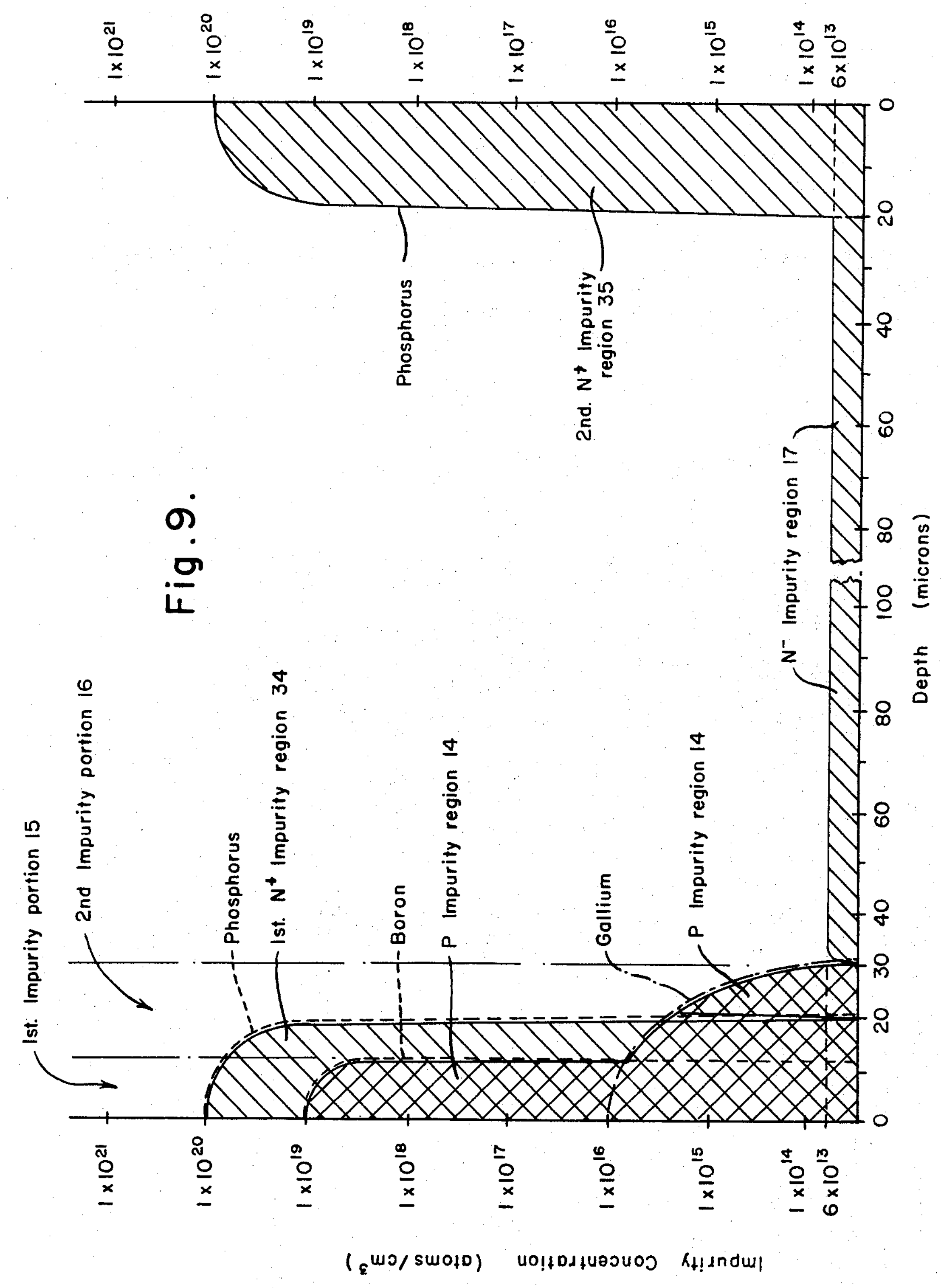
FIG. 9 is an impurity concentration profile of the NPN transistor of FIG. 8.

To further explain the invention, the concentration profile of the NPN transistor, shown in FIG. 8, is set forth in FIG. 9. The impurity concentration in P impurity region 14 (base region 37) is the addition of the boron and gallium concentrations minus the residual N− type impurity concentration extending throughout body 10. The impurity concentrations in N+ impurity region 34 (emitter region 36) are the level of impurity concentrations originally present in body 10 plus the N− type impurity diffused into body 10 minus the gallium and boron impurities there present. And the impurity concentration in N− impurity region 17 (the active collector region 38) corresponds to the residual impurity concentration throughout the body 10. N+ impurity region 35 is also shown for making good ohmic contact to collector region 38.

The resulting NPN transistor has both high voltage and high current capacities. The transistor action is primarily in the thin internal portion 29 with thick peripheral portion 30 functioning only to maintain the voltage capacity of the transistor. The performance characteristics of the transistor can thereby be optimized. The impurity level throughout the starting semiconductor body 10 and the width of the collector region at internal portion 29 can be controlled with precision so that the collector reach-through voltage in the internal portion 29 is just below the design reverse breakdown voltage. No higher voltage capacity need be provided for safe operating conditions. In addition, the high impurity concentrations in the base region adjacent the contact 42 permits the external voltage drop between the emitter and base regions (collector open) to be decreased and in turn the injection efficiency of the transistor to be increased without reducing the breakdown voltage of the transistor. In turn, the gain and the current capacity of the transistor are correspondingly increased.

While the presently preferred embodiments of the invention and methods for performing them have been specifically described, it is distinctly understood that the invention may be otherwise variously embodied and used within the scope of the following claims.

What is claimed is:

1. An NPN transistor comprising: a semiconductor body of resistivity of greater than 30 ohm-cms having first and second opposed major surfaces and thin internal and thick peripheral portions; said thin internal portion being of substantially uniform thickness of greater than about 28 microns and having opposed surfaces each of greater than about 0.10 $cm^2$ in area, and said thick peripheral portion being of thickness greater than about 150 microns and having an radial width greater than about 10 microns; a base region adjoining a major surface at the peripheral portion of the body and comprising first and second impurity portions, first impurity portion adjoining said major surface and having an impurity concentration of boron of at least $1 \times 10^{19}$ atoms per cubic centimeter at said major surface and steep impurity concentration gradient to provide good ohmic and thermal contact properties, and a second contiguous impurity portion in internal portions of the body between emitter and collector regions, and having a lower impurity concentration than the first impurity portion of at least one member of the group consisting of aluminum and gallium and a shallower impurity concentration gradient than the first impurity portion; and an emitter region of N-type impurity concentration adjoining the same major surface as the base region at at least the internal portion of the body and extending into the body to adjoin the second impurity portion of the base region and form a PN junction therewith.

2. An NPN transistor as set forth in claim 1 wherein the impurity concentration of the second impurity portion of the base region is gallium.

3. An NPN transistor as set forth in claim 1 wherein the major surface that the base and emitter regions adjoin is planar in shape.

4. An NPN transistor as set forth in claim 1 wherein the resistivity of the semiconductor body is greater than 80 ohm-cms.

* * * * *